United States Patent
Sato et al.

(10) Patent No.: US 11,824,113 B2
(45) Date of Patent: Nov. 21, 2023

(54) MANAFACTURING METHOD FOR POWER MOSFET SEMICONDUCTOR DEVICE WITH IMPROVED BREAKDOWN VOLTAGE

(71) Applicant: RENESAS ELECTRONICS CORPORATION, Tokyo (JP)

(72) Inventors: Machiko Sato, Tokyo (JP); Akihiro Shimomura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/901,416

(22) Filed: Sep. 1, 2022

(65) Prior Publication Data

US 2022/0416079 A1    Dec. 29, 2022

Related U.S. Application Data

(62) Division of application No. 17/000,533, filed on Aug. 24, 2020, now abandoned.

(30) Foreign Application Priority Data

Oct. 2, 2019   (JP) .................................. 2019-182238

(51) Int. Cl.
| | | |
|---|---|---|
| *H01L 29/78* | (2006.01) | |
| *H01L 29/66* | (2006.01) | |
| *H01L 29/10* | (2006.01) | |

(52) U.S. Cl.
CPC ...... *H01L 29/7813* (2013.01); *H01L 29/1095* (2013.01); *H01L 29/66734* (2013.01)

(58) Field of Classification Search
CPC ............. H01L 29/7813; H01L 29/1095; H01L 29/66734; H01L 29/0623; H01L 29/0634; H01L 29/0688; H01L 29/0696; H01L 29/0878; H01L 29/41766; H01L 29/66727
USPC .......................................................... 257/330
See application file for complete search history.

(56) References Cited

U.S. PATENT DOCUMENTS

| | | | |
|---|---|---|---|
| 8,008,717 B2 | 8/2011 | Kawashima | |
| 2007/0007589 A1* | 1/2007 | Nakagawa | .......... H01L 29/7813 257/E29.066 |
| 2007/0052015 A1* | 3/2007 | Miura | ................. H01L 29/7811 257/E29.066 |

(Continued)

FOREIGN PATENT DOCUMENTS

| | | |
|---|---|---|
| CN | 113748491 A | 12/2021 |
| JP | 2007-012977 A | 1/2007 |

(Continued)

OTHER PUBLICATIONS

Japanese Notice of Reasons for Refusal issue in corresponding Japanese Patent Application No. 2019-182238, dated Feb. 7, 2023, with English translation.

(Continued)

*Primary Examiner* — Mohammad M Hoque
(74) *Attorney, Agent, or Firm* — McDermott Will & Emery LLP

(57) ABSTRACT

A semiconductor device has an impurity region covering a bottom of a gate trench and a column region. A bottom of the column region is deeper than a bottom of the gate trench. The impurity region is arranged between the gate trench and the column region. This structure can improve the characteristics of the semiconductor device.

2 Claims, 22 Drawing Sheets

(56) References Cited

U.S. PATENT DOCUMENTS

| | | | |
|---|---|---|---|
| 2010/0044791 A1* | 2/2010 | Hebert | ................ H01L 29/0634 |
| | | | 257/341 |
| 2017/0330932 A1 | 11/2017 | Sugai et al. | |
| 2017/0338302 A1 | 11/2017 | Hsieh et al. | |
| 2018/0069115 A1 | 3/2018 | Sugai et al. | |

FOREIGN PATENT DOCUMENTS

| | | | |
|---|---|---|---|
| JP | 2010-016309 A | 1/2010 |
| JP | 2012-004458 A | 1/2012 |
| JP | 2017-208380 A | 11/2017 |
| JP | 2018-041853 A | 3/2018 |

OTHER PUBLICATIONS

U.S. PTO Non-Final Office Action issued in related parent U.S. Appl. No. 17/000,533, dated Jan. 20, 2022.
U.S. PTO Final Office Action issued in related parent U.S. Appl. No. 17/000,533, dated Jul. 27, 2022.
U.S. Appl. No. 17/000,533, filed Aug. 24, 2020.
Japanese Notice of Reasons for Refusal issue in corresponding Japanese Patent Application No. 2019-182238, dated Aug. 1, 2023, with English translation.

* cited by examiner

MANUFACTURING METHOD FOR POWER MOSFET SEMICONDUCTOR DEVICE WITH IMPROVED BREAKDOWN VOLTAGE

CROSS-REFERENCE TO RELATED APPLICATIONS

This is a Divisional of U.S. patent application Ser. No. 17/000,533 filed on Aug. 24, 2020, which claims the benefit of Japanese Patent Application No. 2019-182238 filed on Oct. 2, 2019 including the specification, drawings and abstract is incorporated herein by reference in its entirety.

BACKGROUND

Disclosed embodiments relate to a semiconductor device and a method of manufacturing the same, for example, the disclosed embodiments can be suitably applied to the semiconductor device including a power MOSFET (Metal Oxide Semiconductor Field Effect Transistor) semiconductor device.

In the semiconductor device such as the power MOSFET, as a structure for improving breakdown voltage, there is a structure of PN junction called super junction (SJ). For example, in a case of an n-type MOSFET, by alternately arranging the p-type column regions in the n-type drift region, a periphery of the p-type column region can be depleted and the breakdown voltage can be improved.

To reduce an on-resistance in such an SJ structure, it is necessary to reduce a pitch of the gate trench. FIG. 2 is a cross-sectional view showing the comparative example. By reducing the pitch of a gate trench GT, a column region CR contacts the gate trench GT and inhibits a current path. As a result, the on-resistance is raised.

As a method of forming the column region CR, ion implantation is used. However, there is a limit to miniaturization of an ion implantation mask, and it is necessary to take measure to prevent the column region CR from contacting with the gate trench GT because ion implanted impurities diffuse by a subsequent heat treatment.

In Japanese Patent Laid-Open No. JP-A-2010-016309 (Patent Document 1), in the case of the n-type MOSFET, by arranging the p-type column region two-dimensionally in the n-type drift region, the periphery of the p-type column region is depleted and the breakdown voltage can be improved.

SUMMARY

A problem is that by reducing the pitch of the gate trench GT, the laterally expanded portion of the column region comes into contact with the gate trench, hindering the current path. In other words, there is room for improvement from a viewpoint of improving characteristics of the semiconductor device.

Other objects and novel features will become apparent from descriptions of this specification and accompanying drawings.

A semiconductor device according to an embodiment includes a semiconductor substrate, a first impurity region of a first conductivity type formed on the semiconductor substrate, a second impurity region of a second conductivity type opposite to the first conductivity type formed on the first impurity region, a first gate trench and a second gate trench penetrating the second impurity region to reach the first impurity region, gate electrodes embedded in the first gate trench and the second gate trench via gate insulating film respectively, a column region of the second conductivity type formed in the first impurity region between the first gate trench and the second gate trench, and a third impurity region of the first conductivity type formed in the first impurity region covered a bottom portion of the first gate trench. Wherein, a depth of a bottom portion of the column region is deeper than a depth of each of a bottom portion of the first gate trench and the second gate trench, and the third impurity region is formed between the first gate trench and the column region.

A manufacturing method of a semiconductor device according to an embodiment includes; preparing a semiconductor substrate, forming a first impurity region of a first conductivity type on the semiconductor substrate by performing an epitaxial growth method, forming a first gate trench and a second gate trench to reach the first impurity region, forming a second impurity region of the first conductivity type in the first impurity region so as to cover a bottom portion of the first gate trench by performing ion implantation, forming a gate insulating film in each inside of the first gate trench and the second gate trench respectively, forming a gate electrode so as to embed in the first gate trench and the second gate trench via the gate insulating film, forming a third impurity region of a second conductivity type opposite to the first conductivity type in a top portion of the first impurity region so as to leave a bottom portion of the first impurity region, and forming a source region in the first impurity region, and the third impurity region and the source region are formed in this order, and forming a column region of the second conductivity type in the first impurity region between the first gate trench and the second gate trench by performing ion implantation. Wherein, a depth of a bottom portion of the column region is deeper than a depth of each of a bottom portion of the first gate trench and the second gate trench.

According to the semiconductor device and its manufacturing method of semiconductor device according to the embodiments, the characteristics of the semiconductor device can be improved.

DETAILED DESCRIPTION

Figure 1:
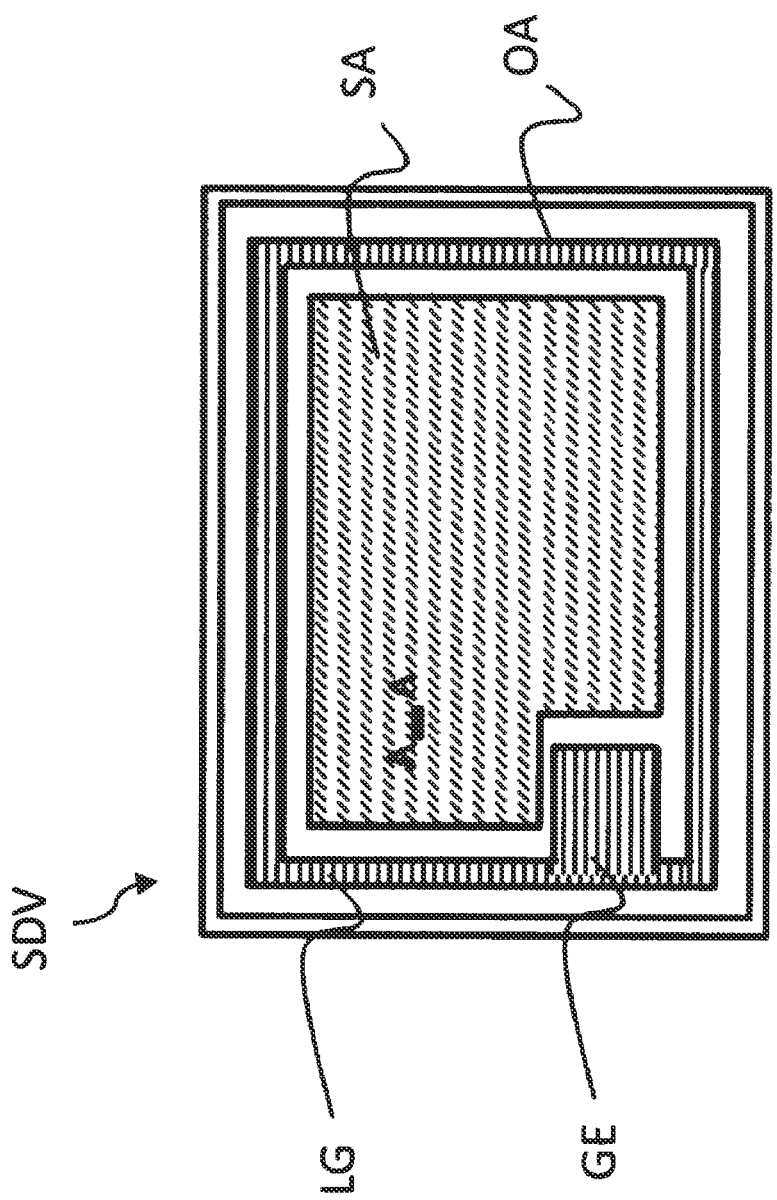
FIG. 1 is a plan view of a semiconductor chip according to a first embodiment.

In following embodiments, when it is necessary for convenience, it is to be described by dividing it into sections or embodiments, but, unless otherwise specified, they are not irrelevant to one another and one is related to some or all of the other, such as modified example, detail, supplemental explanations, and the like. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

The semiconductor device of a first embodiment includes the power MOSFET formed in a semiconductor chip. The power MOSFET has a source, a drain and a gate.

(Related Technology)

First, a semiconductor device having a power MOSFET in a related technology will be described. Here, the related technology is a technology examined by the inventors of the present application and does not mean a known technology.

Figure 2:
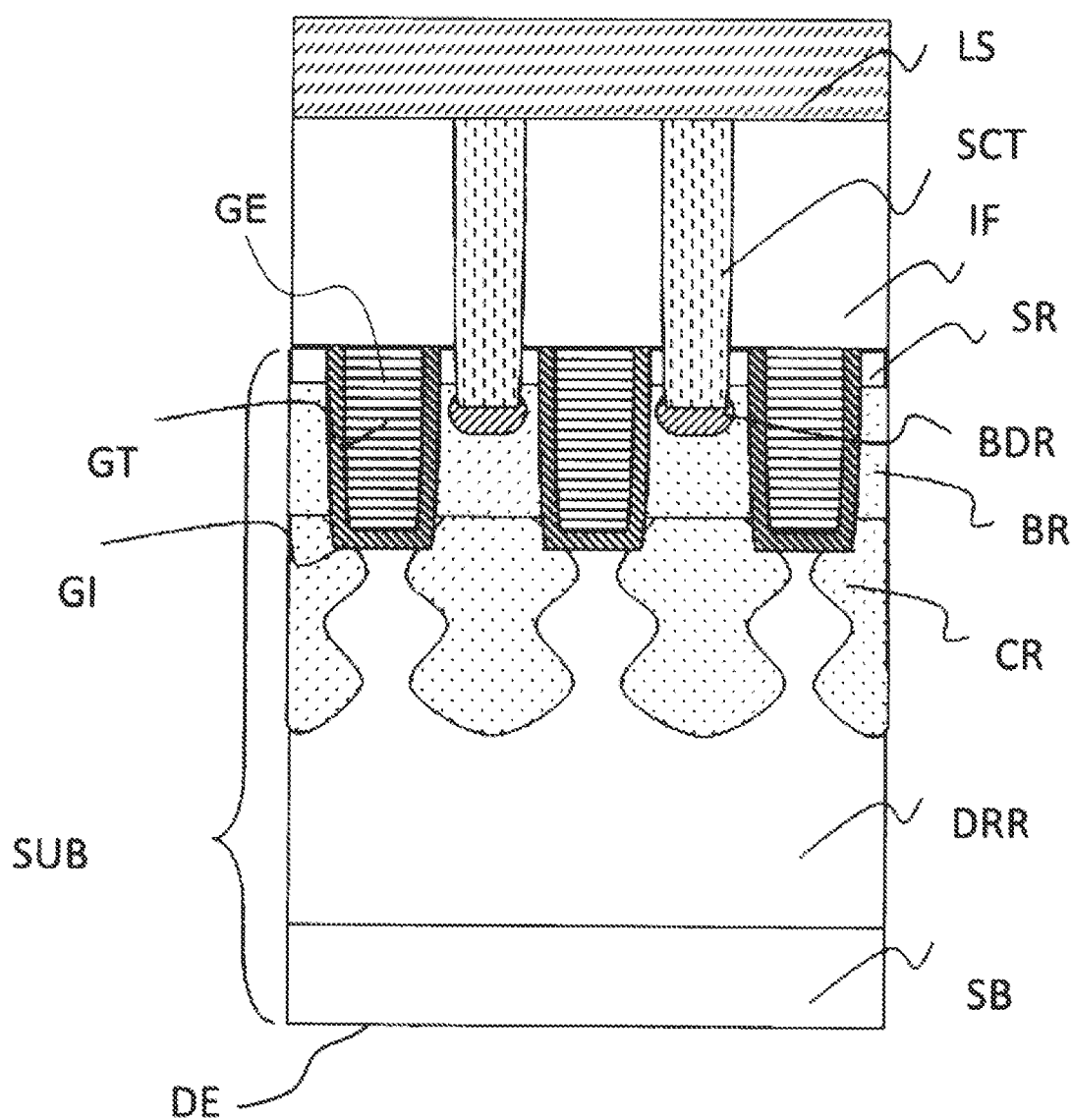
FIG. 2 is a partial cross-sectional view for explaining a semiconductor device according to a comparative example.

FIG. 2 is a partial cross-sectional view of the semiconductor device (see FIG. 1) in the related technology.

As shown in FIG. 2, by arranging the p-type column region CR two-dimensionally in a n-type drift region DRR, a periphery of the p-type column region CR is depleted to improve the breakdown voltage.

Above a semiconductor substrate SB, a first impurity region of a first conductivity type (drift region DRR) is disposed. On the first impurity region (drift region DRR), a second impurity region of a second conductivity type (base region BR), a first gate trench GT and a second gate trench GT formed over the first impurity region (drift region DRR) from the second impurity region (base region BR) are disposed. A gate electrode GE formed via a gate insulating film GI is disposed in each of inside the first gate trench GT and the second gate trench GT. Between the first gate trench GT and the second gate trench GT, the column region CR of the second conductivity type formed in the first impurity region (drift region DRR). And the column region CR is disposed such that a depth of a bottom portion of the column region CR is deeper than a depth of a bottom portions of a plurality of the gate trenches GT. Hereinafter, the plurality of the gate trenches GT, for the same configuration to each other, mainly, will be described only one gate trench GT.

As a means of lowering the on-resistance, it is conceivable to reduce the pitch of the gate trench GT. However, when the pitch of the gate trench GT is reduced, the column region CR contacts the gate trench GT and the current path is inhibited. As a result, the on-resistance rises.

According to the study by the present inventors, it has been found that there is room for improvements in the semiconductor device of the related technology. The room for this improvement will be described below.

(Structure of the Semiconductor Device)

Figure 3:
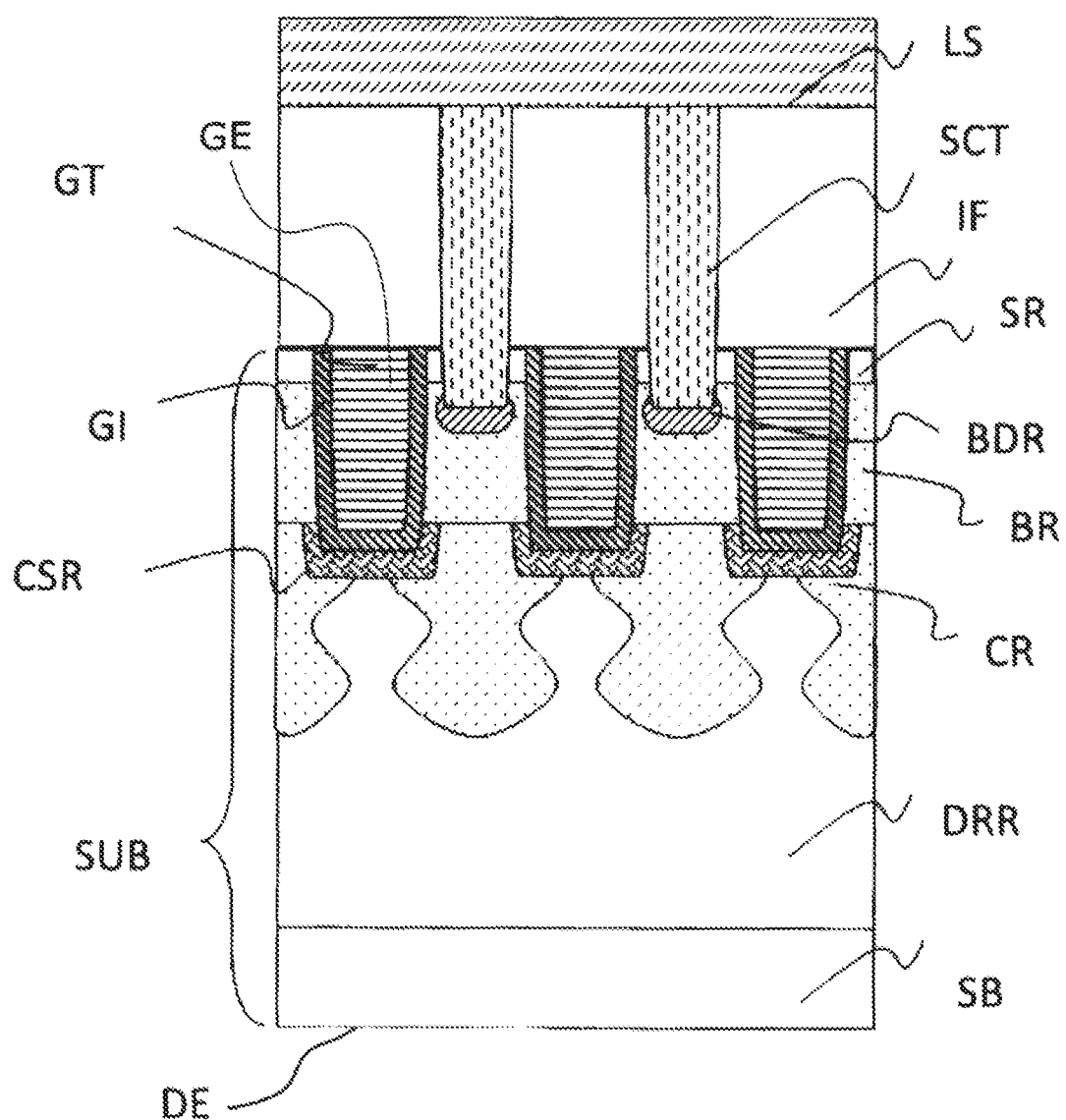
FIG. 3 is a partial cross-sectional view of the semiconductor device according to the first embodiment.

A cross-sectional structure of an example of the semiconductor device according to the first embodiment will be described. As shown in FIG. 3, in the semiconductor device, a column control region CSR is disposed near the gate trench GT.

Above the semiconductor substrate SB, the first impurity region of the first conductivity type (drift region DRR) is disposed. On the first impurity region (drift region DRR), the second impurity region of the second conductivity type (base region BR), the first gate trench GT and the second gate trench GT formed over the first impurity region (drift region DRR) from the second impurity region (base region BR) are disposed. The gate electrode GE formed via the gate insulating film GI is disposed in each inside of the first gate trench GT and the second gate trench GT. Between the first gate trench GT and the second gate trench GT, the column region CR of the second conductivity type formed in the first impurity region (drift region DRR). And the column region CR is disposed such that the depth of the bottom portion of the column region CR is deeper than the depth of the bottom portions of the plurality of the gate trenches GT. A third impurity region of the first conductivity type formed in the first impurity region covering the bottom portion of the first gate trench GT (drift region DRR) (column control region CSR) is disposed. The third impurity region (column control region CSR) is disposed between the first gate trench GT and the column region CR. The third impurity region (column control region CSR) is in contact with bottom surfaces of the first gate trench GT and the second gate trench GT and side surfaces connected to those bottom surfaces. And a bottom surface of the third impurity region (column control region CSR) is in contact with the first impurity region (drift region DRR).

An impurity density of the third impurity region (column control region CSR) is higher than an impurity density of the first impurity region (drift region DRR).

The column region CR overlaps the third impurity region CSR in plan view.

FIG. 1 is a plan view of the semiconductor device SDV according to the first embodiment. As shown in FIG. 1, the semiconductor device SDV has a semiconductor substrate SUB (see FIG. 3) using a single crystal of silicon (Si). Furthermore, the semiconductor substrate SUB has an element region SA having the MOSFET, and an outer peripheral region OA located outside of the element region SA. A Source electrode is provided on upper surface of the element region SA. A gate wiring LG is disposed on upper surface of a portion of the outer peripheral region OA, the gate wiring LG is connected to the gate electrode GE disposed on upper surface of the portion of the outer peripheral region OA. A drain electrode DE is provided on a bottom surface of the semiconductor substrate SUB. FIG. 3 shows A-A cross section shown in the element region SA of FIG. 1.

Figure 4:
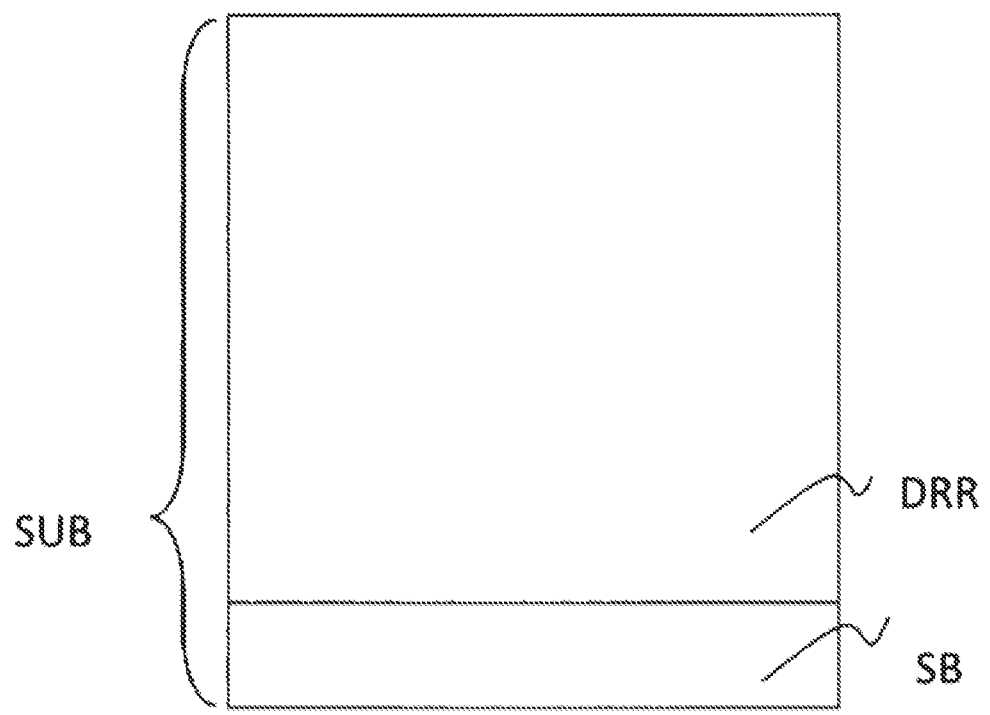
FIG. 4 is a partial cross-sectional view showing a step of manufacturing method of the semiconductor device in the first embodiment.

Next, an exemplary manufacturing method of the semiconductor device will be described. First, for example, the semiconductor substrate SB made of the single crystal of silicon (Si) is prepared. The semiconductor substrate SB is, for example, a semiconductor base material doped with phosphorus (P) or arsenic (As). An impurity density of the semiconductor substrate SB is, for example, about $1 \times 10^{19}$ cm$^{-3}$~$1 \times 10^{20}$ cm$^{-3}$. Next, as shown in FIG. 4, on the semiconductor substrate SB, the first impurity region of the first conductivity type (drift region DRR) is formed by an epitaxial growth method. The first impurity region (drift region DRR) is epitaxially grown silicon while doping, for example, phosphorus (P), arsenic (As), or the like. The impurity density of the first impurity region (drift region DRR) is, for example, about $1 \times 10^{16}$ cm$^{-3}$~$1 \times 10^{17}$ cm$^{-3}$.

Figure 5:
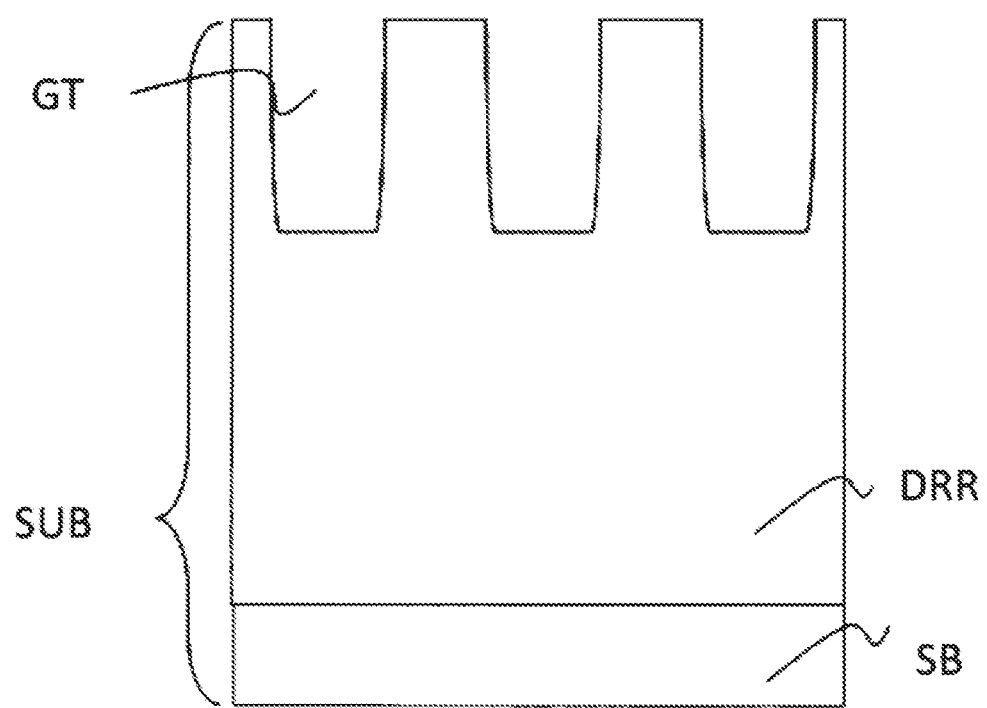
FIG. 5 is a partial cross-sectional view showing a step performed after the step of shown in FIG. 4 in the first embodiment.

Next, as shown in FIG. 5, the plurality of the gate trenches GT is formed over an inside of the first impurity region (drift region DRR) by performing photolithography and silicon etching.

Figure 6:
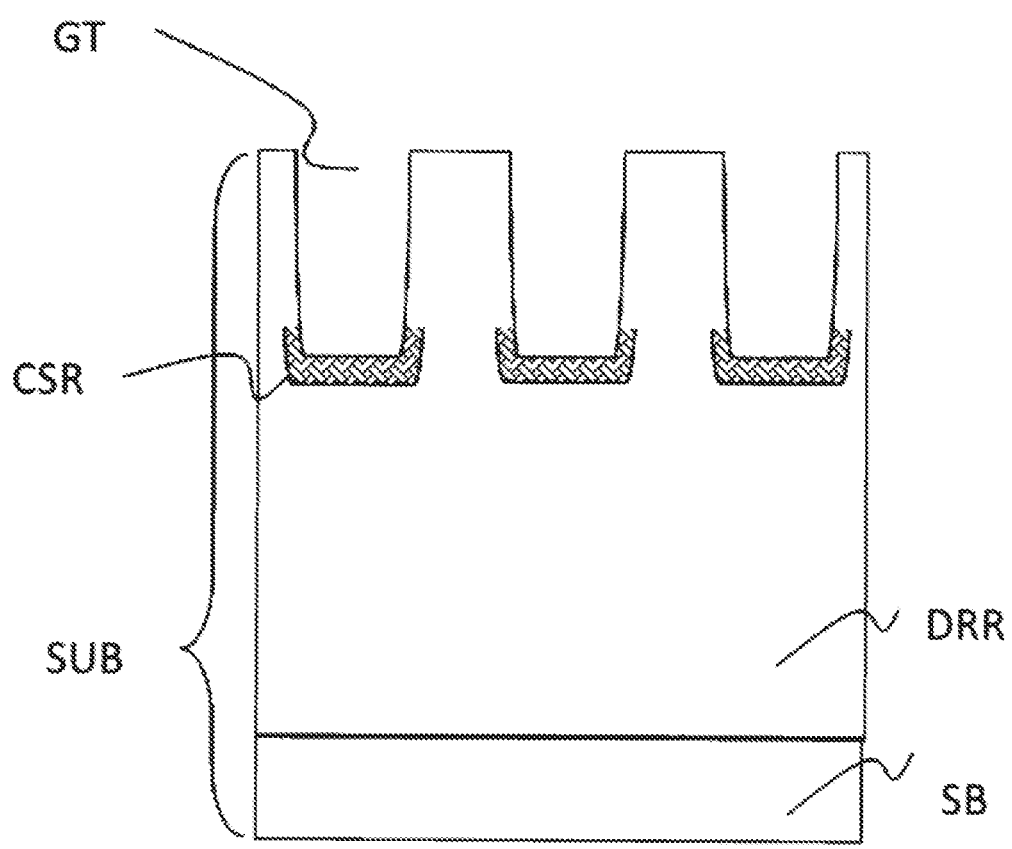
FIG. 6 is a partial cross-sectional view showing a step performed after the step of shown in FIG. 5 in the first embodiment.

As shown in FIG. 6, the third impurity region (column control region CSR) of the first conductivity type is formed in the first impurity region by performing ion implantation so as to cover a bottom portion of the gate trench GT. The third impurity region is formed, for example, by performing ion implantation of arsenic (As) or phosphorus (P). Here, an angle of the ion implantation can be appropriately selected. The angle of ion implantation, that is, the angle from the perpendicular line (Tilt angle), is, for example, 0 to 45 degrees. In particular, since the angle from the perpendicular is 0 to 23 degrees, the column control region CSR can be efficiently formed at the bottom portion of the gate trench GT. When the ion species are arsenic, the implantation energy is, for example, 5 to 200 keV. In particular, since the implantation energy of 20 to 60 keV, the column control region CSR can be efficiently formed in a vicinity of the gate trench GT. When the ion species are phosphorus, the implantation energy is 5 to 100 keV. In particular, since the implantation energy of 5 to 60 keV, the column control region CSR can be efficiently formed in the vicinity of the gate trench GT. The impurity density of the third impurity region (column control region CSR) is, for example, about $1 \times 10^{16}$ cm$^{-3}$~$1 \times 10^{17}$ cm$^{-3}$. After performing the ion implantation, wet etching such as hydrofluoric acid is performed to remove an implanted damaged layer.

Figure 7:
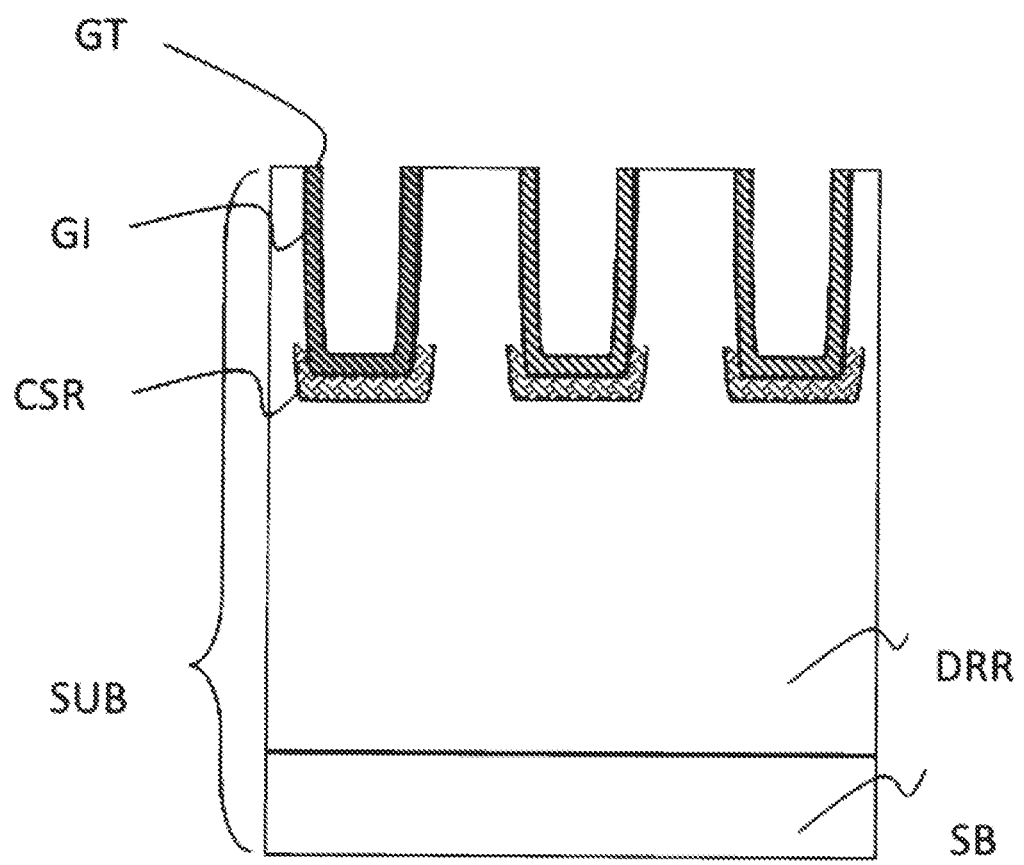
FIG. 7 is a partial cross-sectional view showing a step performed after the step of shown in FIG. 6 in the first embodiment.

Next, as shown in FIG. 7, the gate insulating film GI is formed in each inside of the plurality of the gate trenches GT. The gate insulating film GI is formed, for example, by thermal oxidation. A thermal oxide film formed by this thermal oxidation is also formed on the semiconductor substrate of a top portion of the gate trenches GT.

Figure 8:
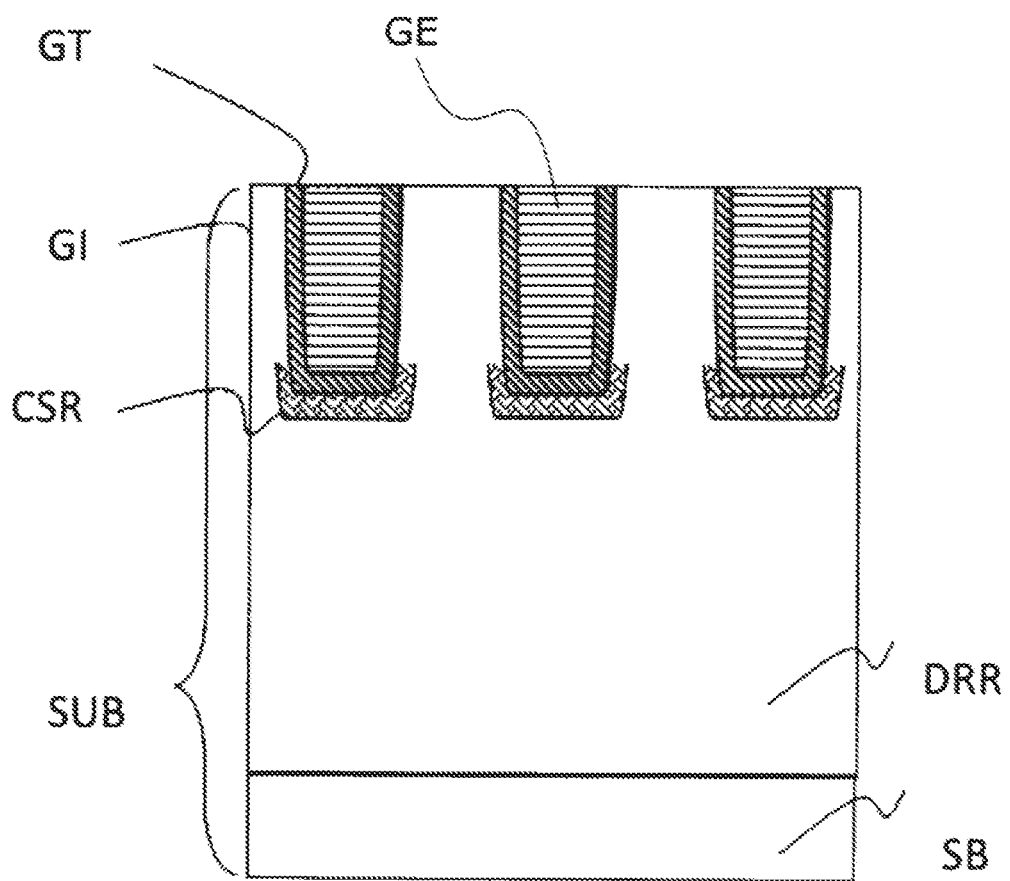
FIG. 8 is a partial cross-sectional view showing a step performed after the step of shown in FIG. 7 in the first embodiment.

Next, as shown in FIG. 8, the gate electrode GE is embedded in each of the plurality of the gate trenches GT via the gate insulating film GI. For example, a polysilicon layer is formed by CVD (Chemical Vapor Deposition) method, and the polysilicon layer is embedded in the gate trench GT. Subsequently, the polysilicon layer on the semiconductor substrate SUB is removed by dry etching or the like.

Figure 9:
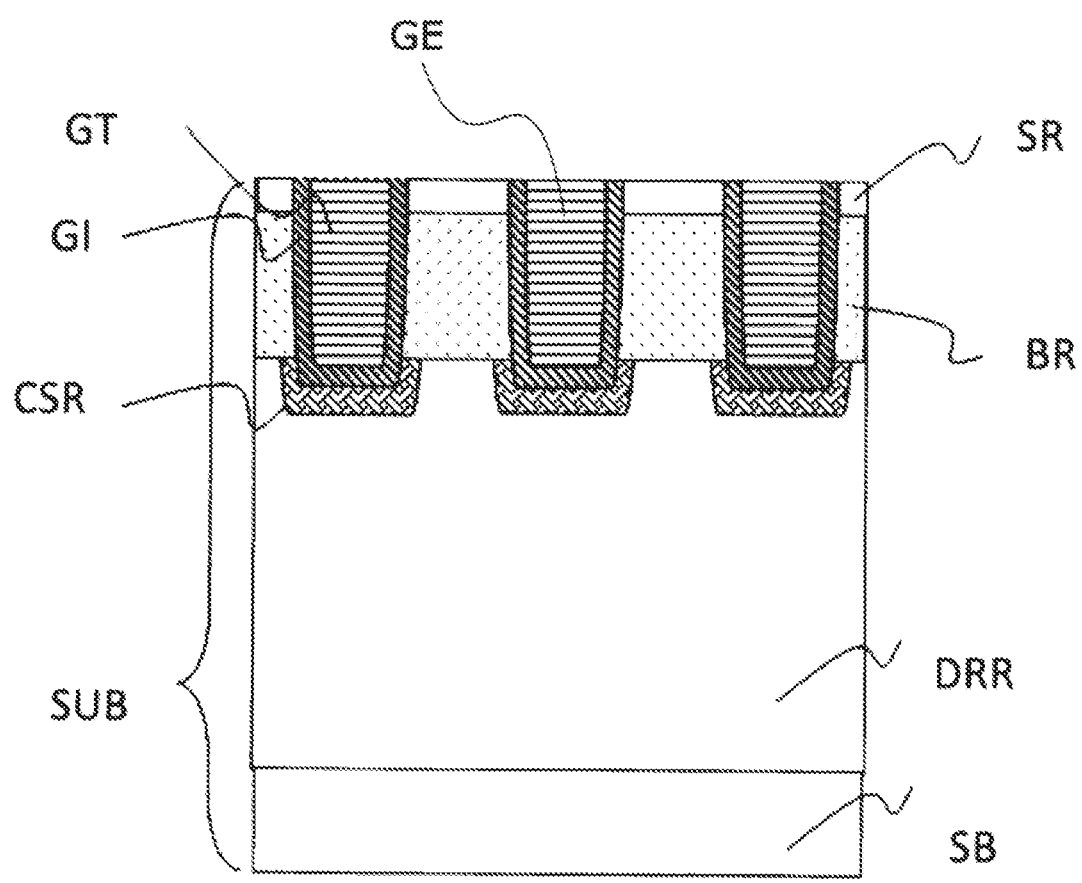
FIG. 9 is a partial cross-sectional view showing a step performed after the step of shown in FIG. 8 in the first embodiment.

Next, as shown in FIG. 9, the second impurity region of the second conductivity type on an upper side (base region BR) and a source region SR of the first conductivity type are formed with leaving the first impurity region below the first impurity region (drift region DRR). And the second impurity region and the source region SR are formed in this order. The second impurity region (base region BR) is formed by performing photolithography and ion implantation of boron (B) or arsenic difluoride (BF2), for example. An impurity density of the second impurity region BR is, for example, about $1 \times 10^{16}$ cm$^{-3}$~$1 \times 10^{17}$ cm$^{-3}$. The source region SR is formed by performing photolithography and ion implantation of arsenic (As) or phosphorus (P), for example. An impurity density of the source region SR is, for example, about $1 \times 10^{20}$ cm$^{-3}$~$1 \times 10^{21}$ cm$^{-3}$.

Figure 10:
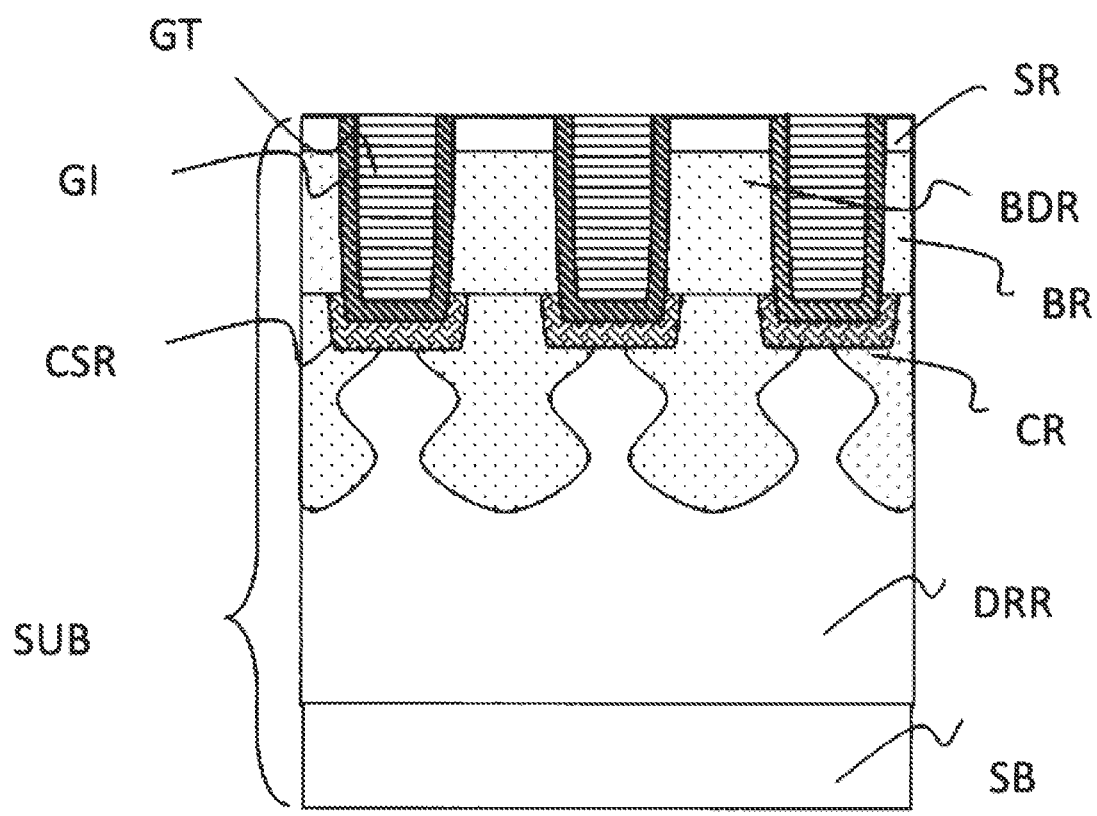
FIG. 10 is a partial cross-sectional view showing a step performed after the step of shown in FIG. 9 in the first embodiment.

Next, as shown in FIG. 10, the second conductivity type column region CR is formed by performing ion implantation inside the first impurity region between the first gate trench GT and the second gate trench GT. The depth of the bottom of the column region CR is deeper than the depth of the bottom of each of the first gate trench GT and the second gate trench GT. The column region CR is formed by performing photolithography and ion implantation of boron (B) or arsenic difluoride (BF2), for example. Here, this ion implantation may be performed by dividing into a plurality of times and changing implantation energy or dose amount, respectively. An impurity density of the column region CR is, for example, about $1 \times 10^{16}$ cm$^{-3}$~$1 \times 10^{17}$ cm$^{-3}$.

Next, as shown in FIG. 3, an interlayer insulating film IF is formed. The interlayer insulating film IF is formed by depositing an insulating film, for example, such as BPSG (Boron Phosphorous Silicon Glass) or plasma oxide film by CVD method. Next, a source contact SCT is formed. The source contact SCT is formed by performing photolithography and dry etching the interlayer insulating film IF. Next, a contact region BDR is formed. The contact region BDR is formed by performing ion implantation of boron (B) or arsenic difluoride (BF2), for example, through the source contact SCT. An impurity density of the contact region BDR is, for example, about $5\times10^{18}$ cm$^{-3}$~$1\times10^{20}$ cm$^{-3}$. An optimum ranges of the impurity density is, for example, about $1\times10^{19}$ cm$^{-3}$~$5\times10^{19}$ cm$^{-3}$. Incidentally, following dry etching of the interlayer insulating film IF, dry etching of the semiconductor substrate SUB may be performed. In this case, it is formed so as to penetrate the source region SR and reach the second impurity region (base region BR). Next, a source contact plug is formed. The source contact plug is formed that after forming a titanium (Ti) film and a titanium nitride (TiN) film in the source contact SCT by, for example, CVD method, a tungsten (W) film is embedded, and the tungsten film on the interlayer insulating film IF is removed by CMP (Chemical Mechanical Polishing). Next, a source wiring LS is formed. The source wiring LS is formed, for example, by forming an aluminum (Al) film on the interlayer insulating film IF by a sputtering method and patterning the aluminum film by performing photolithography and dry etching. Thereafter, the semiconductor device SDV is ground to a predetermined thickness. And a layer of titanium-nickel-silver (Ti—Ni—Ag) or the like is formed on a bottom surface of the semiconductor device SDV by, for example, a sputtering method. Thereby, the drain electrode DE is formed.

Figure 11:
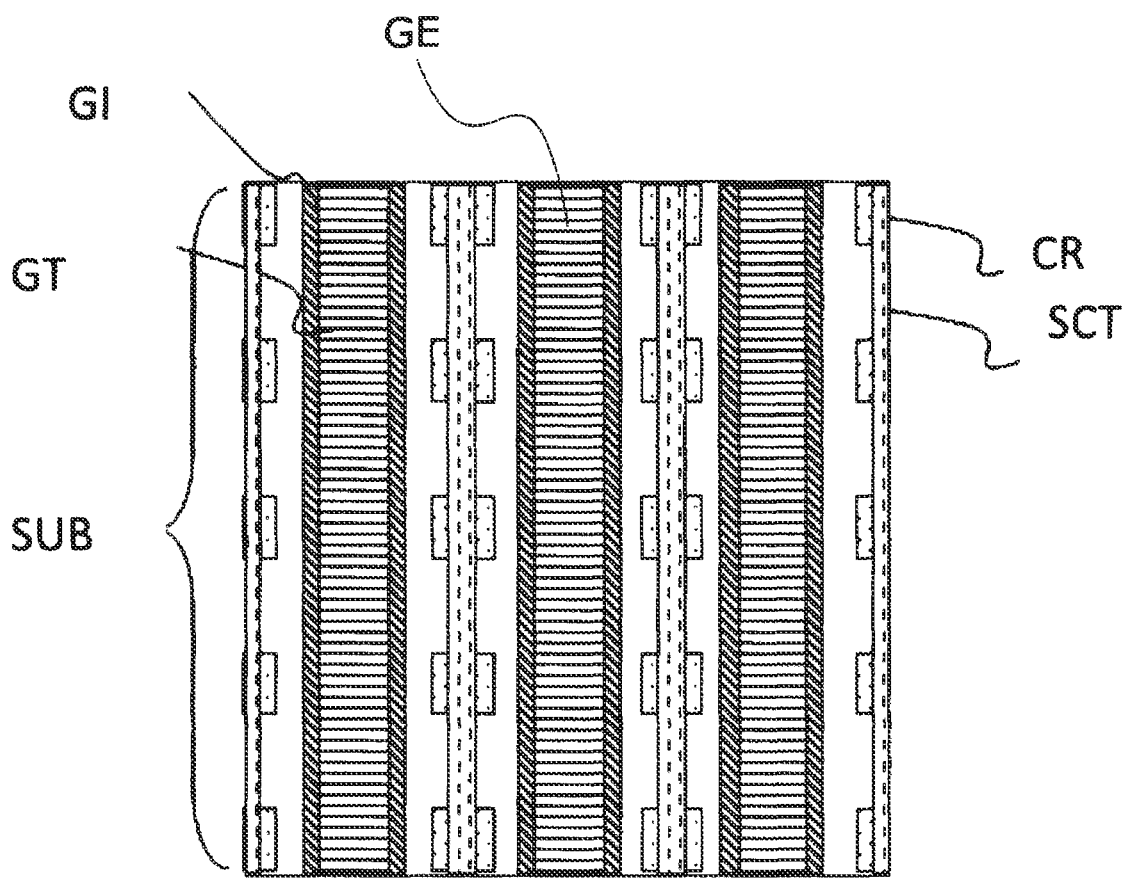
FIG. 11 is a partial plan view of the semiconductor device according to the first embodiment.
Figure 12:
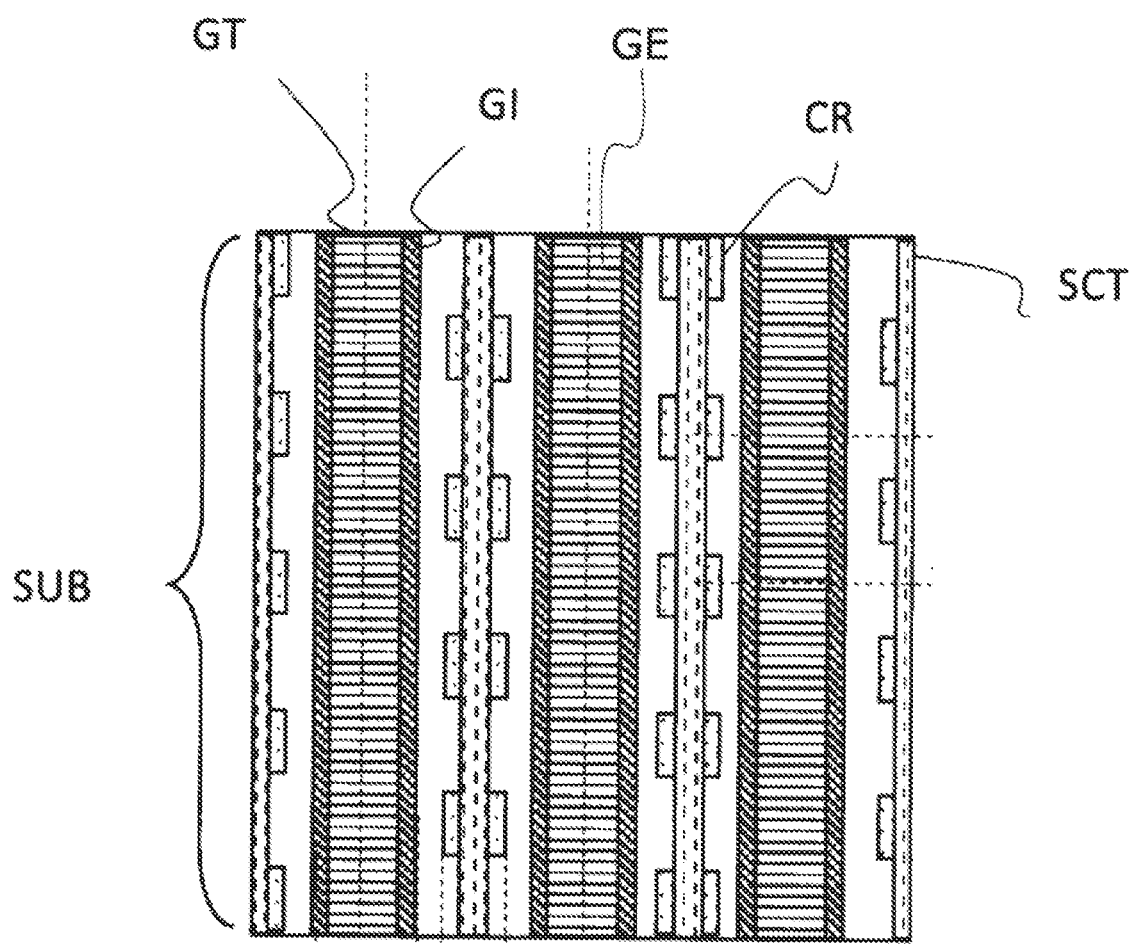
FIG. 12 is a partial plan view of a modified example of the semiconductor device according to the first embodiment.
Figure 13:
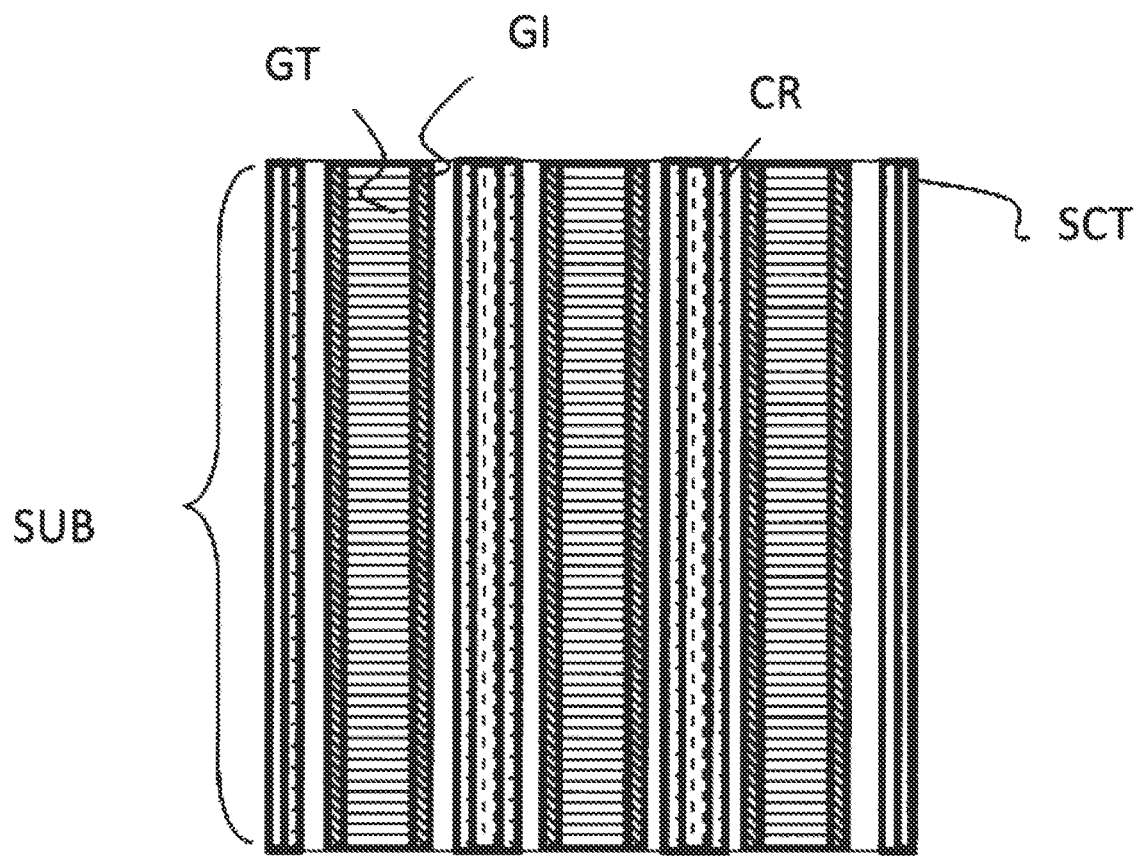
FIG. 13 is a partial plan view of a modified example of the semiconductor device according to the first embodiment.

FIG. 11 shows a partial plan view of the element region SA of FIG. 1. In FIG. 11, an arrangement of the gate trench GT, gate insulating film GI, the gate electrode GE, the source contact SCT and the column region CR are illustrated. The gate trench GT is formed in a stripe shape in the element region SA. The source contact SCT is disposed in a center between the gate trenches GT that are separated from each other and are formed in the stripe shape. The column region CR is located in the center between the gate trenches GT spaced from each other, that is, below the source contact SCT. Further, a planar shape of the column region CR is circular or quadrangular dots, and each of a plurality of the column regions CR is disposed apart from each other. In FIG. 11, the column regions CR are shown as square dots, but they may be arranged in a staggered manner (see FIG. 12). Further, the square dots are not only arranged in a square arrangement but may be formed in the stripe shape parallel to the gate trench GT (see FIG. 13).

The effect of the first embodiment will be explained. For comparison, the comparative example will be described. In the semiconductor device SDV according to the comparative example shown in FIG. 2, by reducing the pitch of the gate trench GT, the column region CR contacts the gate trench GT and inhibiting the current path. As described above, in the comparative example, there is room for improvement in that the current path is inhibited due to a reduction of the pitch of the gate trench GT, and a performance of the semiconductor device deteriorates.

In the semiconductor device SDV described above, in contrast to the semiconductor device SDV according to the comparative example, the third impurity region of the first conductivity type (column control region CSR) is formed in the first impurity region covering the bottom portion of the gate trench GT. In plan view, since the column region CR overlaps the third impurity region (column control region CSR), even if the pitch of the gate trench GT is reduced, the column region CR does not come into contact with the gate trench GT. And then, it does not inhibit the current path. Therefore, it is possible to reduce the pitch of the gate trench GT, and it is possible to reduce a chip area.

In addition, since a part of the first impurity region (drift region DRR) becomes the third impurity region (column control region CSR) having a higher impurity density, there is an effect of lowering a resistance value, and the on-resistance can be reduced.

Second Embodiment

In the first embodiment, the third impurity region (column control region CSR) is formed after the gate trench GT is formed (see FIG. 3). Here, a case will be described in which the column control region CSR is formed before the formation of the gate trench GT and the gate trench GT is formed so that the bottom portion of the gate trench GT reaches the column control region CSR when the gate trench GT is formed (see FIGS. 16 to 17).

Figure 14:
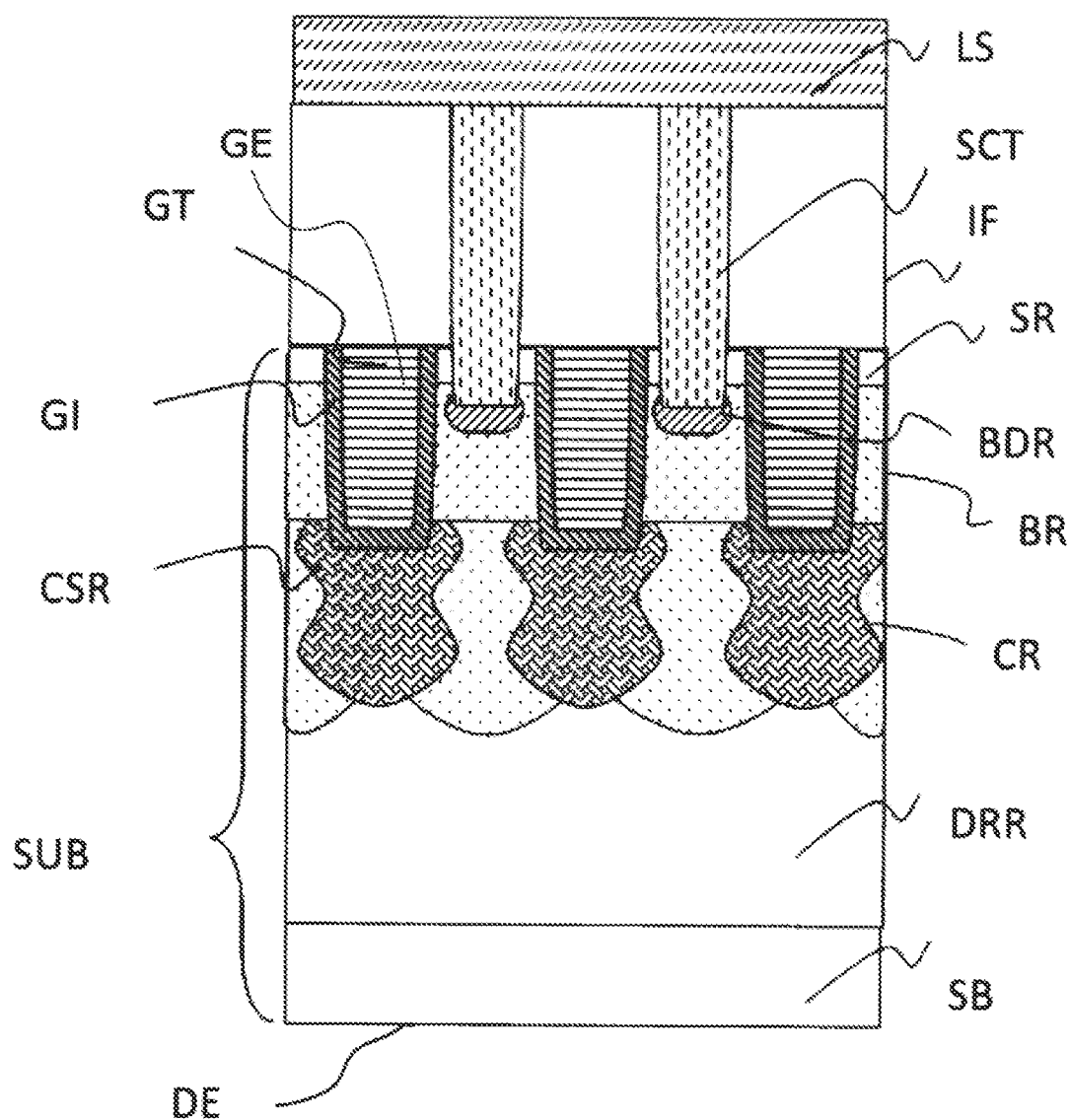
FIG. 14 is a partial cross-sectional view of a semiconductor device according to a second embodiment.

A cross-sectional structure of an example of the semiconductor device SDV according to a second embodiment will be described. As shown in FIG. 14, a multi-stage column control region CSR of n-type covering the bottom portion of the gate trench GT is disposed between the gate trench GT and the column region CR.

Above the semiconductor substrate SB, the first impurity region of the first conductivity type (drift region DRR) is disposed. On the first impurity region (drift region DRR), the second impurity region of the second conductivity type (base region BR), the first gate trench GT and the second gate trench GT formed over the first impurity region (drift region DRR) from the second impurity region (base region BR) are disposed. The gate electrode GE formed via the gate insulating film GI is disposed in each inside of the first gate trench GT and the second gate trench GT. Between the first gate trench GT and the second gate trench GT, the column region CR of the second conductivity type formed in the first impurity region (drift region DRR). And the column region CR is disposed such that a depth of a bottom portion of the column region CR is deeper than the depth of the bottom portions of the plurality of the gate trenches GT. The third impurity region of the first conductivity type formed in the first impurity region covering the bottom of the first gate trench GT (drift region DRR) (column control region CSR) is disposed. The third impurity region (column control region CSR) is disposed between the first gate trench GT and the column region CR. The third impurity region CSR has the multi-stage structure extending toward the semiconductor substrate SB. The third impurity region (column control region CSR) is in contact with the bottom surfaces of the first gate trench GT and the second gate trench GT and the side surfaces connected to those bottom surfaces. And the bottom surface of the third impurity region (column control region CSR) is in contact with the first impurity region (drift region DRR).

The impurity density of the third impurity region (column control region CSR) is higher than the impurity density of the first impurity region (drift region DRR).

The column region CR overlaps the third impurity region CSR in plan view.

FIG. 1 is a plan view of semiconductor device SDV according to the first embodiment. As shown in FIG. 1, semiconductor device SDV has the semiconductor substrate SUB (see FIG. 4) using the single crystal of silicon (Si). Furthermore, the semiconductor substrate SUB has the element region SA having the MOSFET, and the outer peripheral region OA located outside of the element region SA. The source electrode is provided on upper surface of the element region SA. The gate wiring LG is disposed on upper surface of the portion of the outer peripheral region OA, the gate wiring LG is connected to the gate electrode GE disposed on upper surface of the portion of the outer peripheral region OA. The drain electrode DE is provided on the bottom surface of the semiconductor substrate SUB. FIG. 14 shows A-A cross section shown in the element region SA of FIG. 1.

Figure 15:
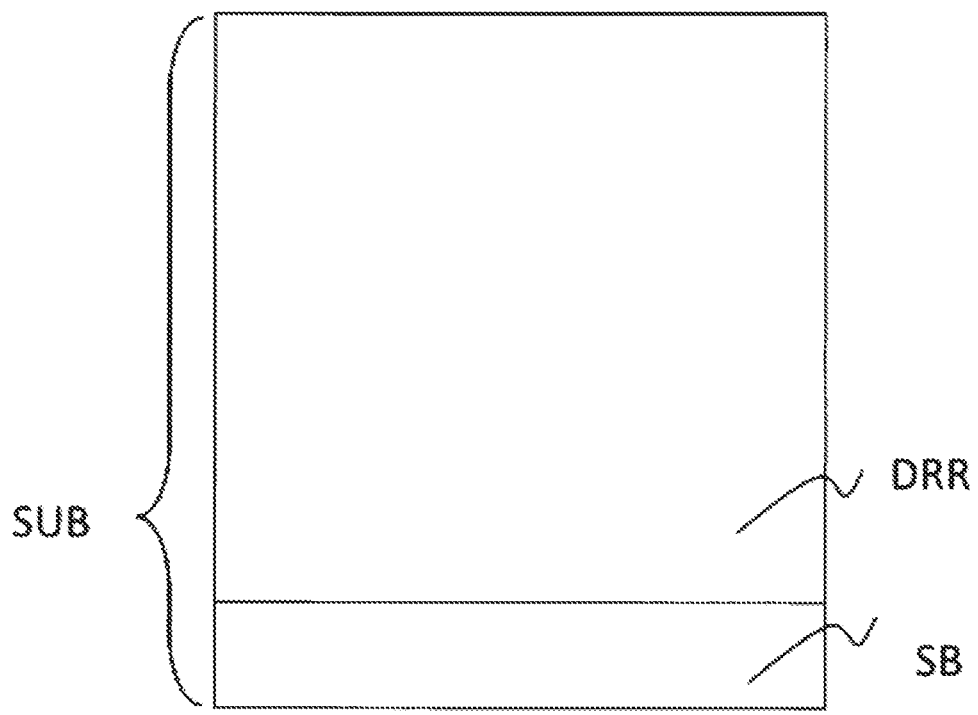
FIG. 15 is a partial cross-sectional view showing a step of manufacturing method of the semiconductor device in the second embodiment.

Next, an exemplary manufacturing method of the semiconductor device will be described. First, for example, the semiconductor substrate SB made of the single crystal of silicon (Si) is prepared. The semiconductor substrate SB is, for example, the semiconductor base material doped with phosphorus (P) or arsenic (As). The impurity density of the semiconductor substrate SB is, for example, about $1\times10^{19}$ $cm^{-3}$~$1\times10^{20}$ $cm^{-3}$. Next, as shown in FIG. 15, on the semiconductor substrate SB, the first impurity region of the first conductivity type (drift region DRR) is formed by the epitaxial growth method. The first impurity region (drift region DRR) is epitaxially grown silicon while doping, for example, phosphorus (P), arsenic (As), or the like. The impurity density of the first impurity region (drift region DRR) is, for example, about $1\times10^{16}$ $cm^{-3}$~$1\times10^{17}$ $cm^{-3}$.

Figure 16:
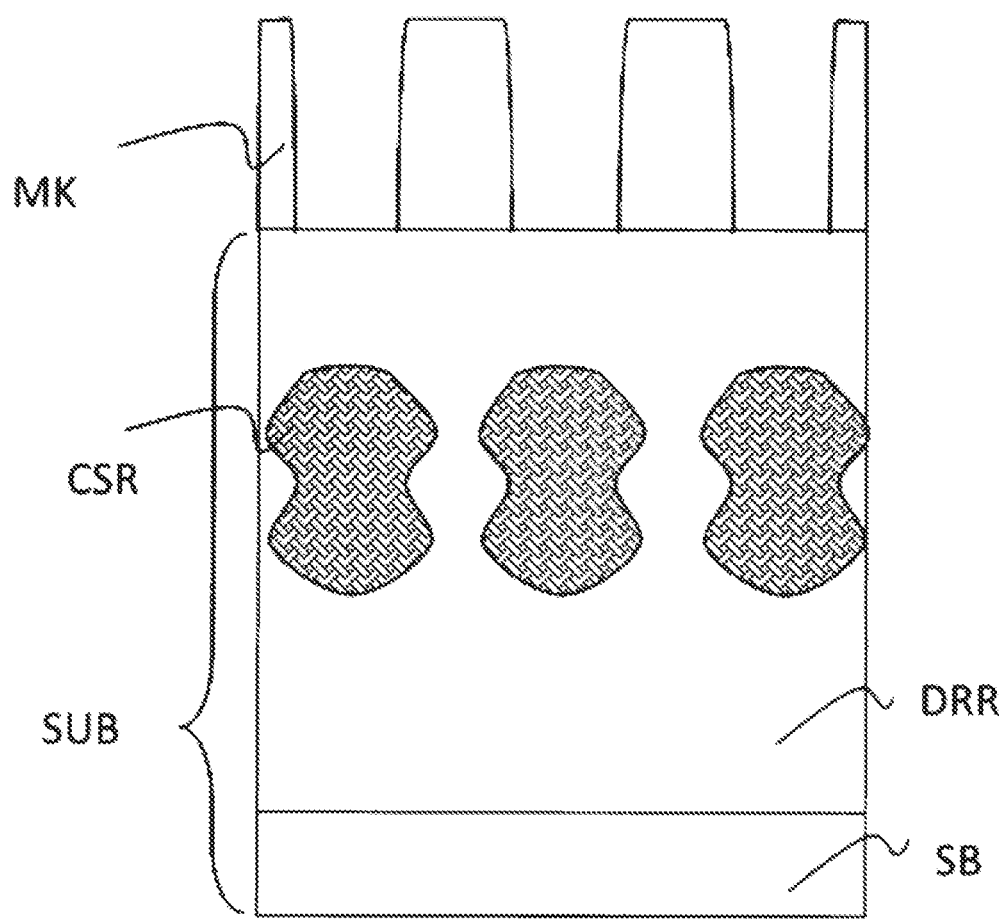
FIG. 16 is a partial cross-sectional view showing a step performed after the step of shown in FIG. 15 in the second embodiment.

Next, as shown in FIG. 16, inside the first impurity region (drift region DRR), a plurality of the third impurity regions of the first conductivity type (column control region CSR) are formed by performing ion implantation. The third impurity region (column control region CSR) is formed by performing photolithography and ion implantation of phosphorus (P) or arsenic (As), for example. The ion implantation may be performed in a plurality of times. And implantation energy, dose amount, or the like may be changed. The angle of ion implantation, that is, the angle from the perpendicular line (Tilt angle), is, for example, 0 to 10 degrees The impurity density of the third impurity region (column control region CSR) is, for example, about $1\times10^{16}$ $cm^{-3}$~$1\times10^{17}$ $cm^{-3}$.

Figure 17:
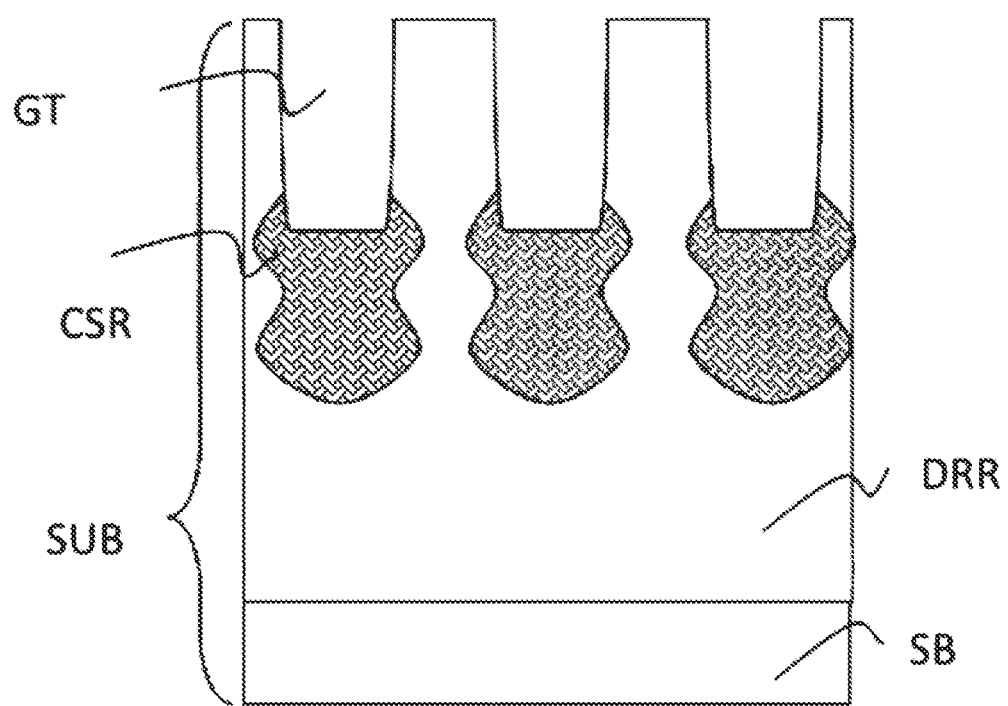
FIG. 17 is a partial cross-sectional view showing a step performed after the step of shown in FIG. 16 in the second embodiment.

Next, as shown in FIG. 17, to form a plurality of gate trenches GT in the first impurity region (drift region DRR) to reach the plurality of the third impurity regions (column control region CSR) by performing photolithography and silicon etching.

Figure 18:
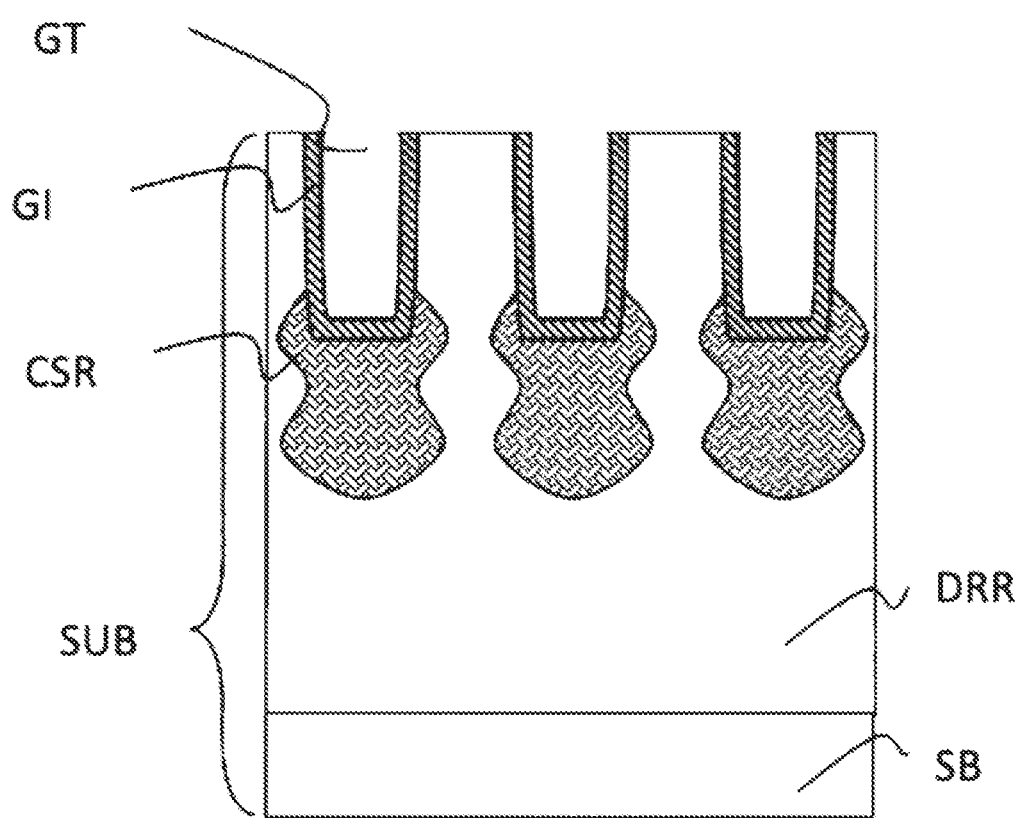
FIG. 18 is a partial cross-sectional view showing a step performed after the step of shown in FIG. 17 in the second embodiment.

Next, as shown in FIG. 18, the gate insulating film GI is formed in each inside of the plurality of gate trenches GT. The gate insulating film GI is formed, for example, by thermal oxidization. A thermal oxide film formed by this thermal oxidation is also formed on the semiconductor substrate of a top portion of the gate trenches GT.

Figure 19:
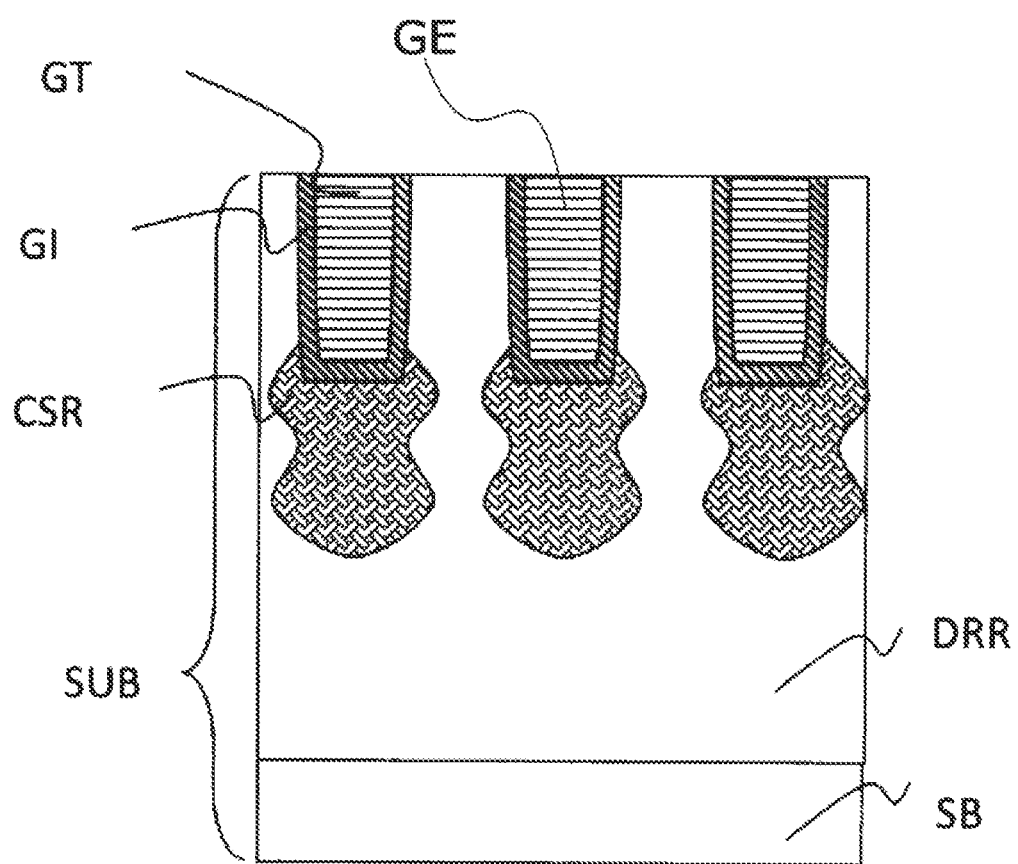
FIG. 19 is a partial cross-sectional view showing a step performed after the step of shown in FIG. 18 in the second embodiment.

Next, as shown in FIG. 19, the gate electrode GE is embedded in each of the plurality of gate trenches GT via the gate insulating film GI. For example, the polysilicon layer is formed by CVD method, and the polysilicon layer is embedded in the gate trench GT. Subsequently, the polysilicon layer on the semiconductor substrate SUB is removed by dry etching or the like.

Figure 20:
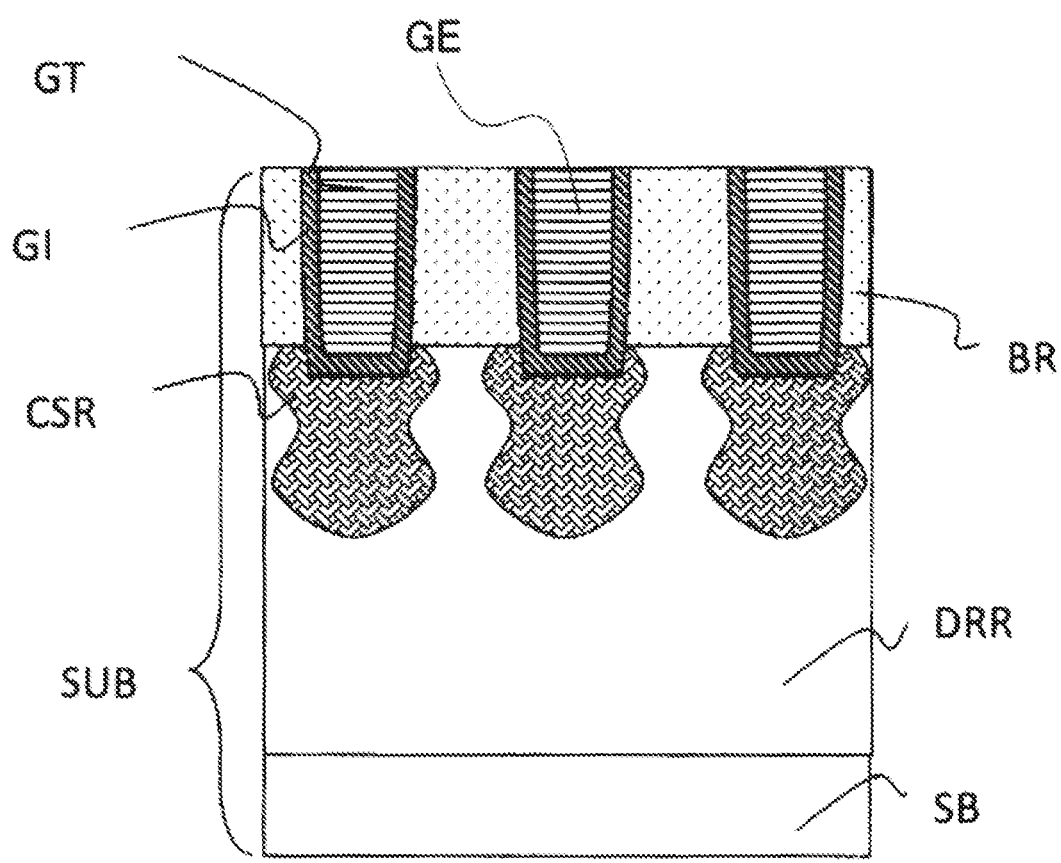
FIG. 20 is a partial cross-sectional view showing a step performed after the step of shown in FIG. 19 in the second embodiment.

Next, as shown in FIG. 20, the second impurity region of the second conductivity type is formed in the upper side of the first impurity region with leaving the first impurity region below the first impurity region (drift region DRR). The second impurity region (base region BR) is formed by performing photolithography and ion implantation of boron (B) or arsenic difluoride (BF2), for example. The impurity density of the second impurity region BR is, for example, about $1\times10^{16}$ $cm^{-3}$~$1\times10^{17}$ $cm^{-3}$.

Figure 21:
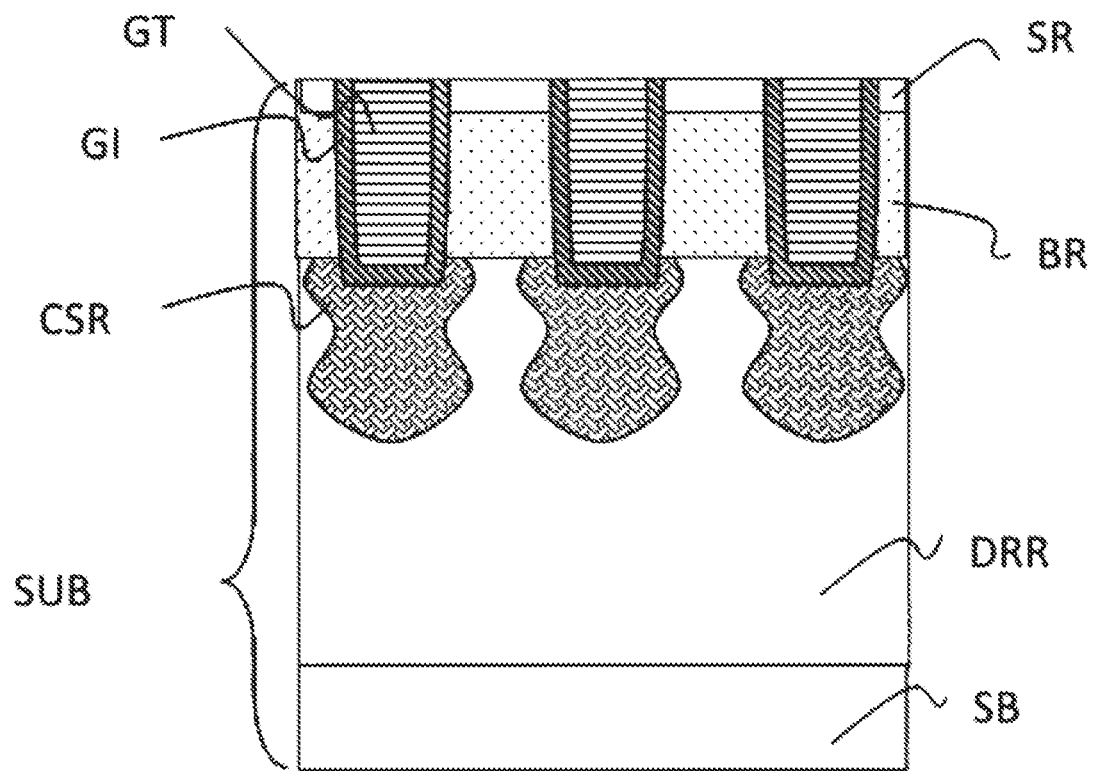
FIG. 21 is a partial cross-sectional view showing a step performed after the step of shown in FIG. 20 in the second embodiment.

Next, as shown in FIG. 21, the source region SR of the first conductivity type on the second impurity region (base region BR) is formed. The source region SR is formed by performing photolithography and ion implantation of arsenic (As) or phosphorus (P), for example. The impurity density of the source region SR is, for example, about $1\times10^{20}$ $cm^{-3}$~$1\times10^{21}$ $cm^{-3}$.

Figure 22:
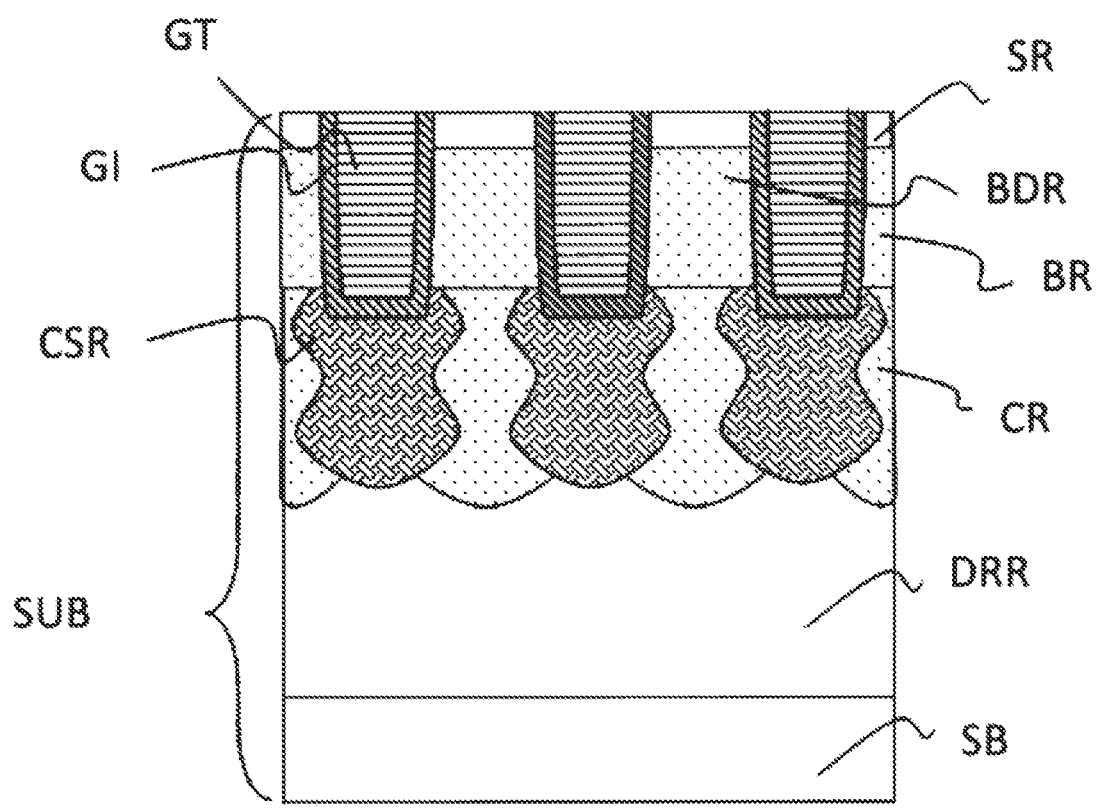
FIG. 22 is a partial cross-sectional view showing a step performed after the step of shown in FIG. 21 in the second embodiment.

Thereafter, as shown in FIG. 22, inside the first impurity region between each of the plurality of gate trenches GT, a plurality of column regions CR of the second conductivity type are formed by performing ion implantation. The depth of the bottom portion of the column region CR is deeper than the depth of the bottom portions of the plurality of the gate trenches GT. The column region CR is formed by performing photolithography and ion implantation of boron (B) or arsenic difluoride (BF2), for example. Here, this ion implantation may be performed by dividing into a plurality of times and changing the implantation energy or dose amount, respectively. The impurity density of the column region CR is, for example, about $1\times10^{16}$ $cm^{-3}$~$1\times10^{17}$ $cm^{-3}$.

Next, as shown in FIG. 14, the interlayer insulating film IF is formed. The interlayer insulating film IF is formed by depositing an insulating film, for example, BPSG or plasma oxide film by CVD method. Next, the source contact SCT is formed. The source contact SCT is formed by performing photolithography and dry etching the interlayer insulating film IF. Next, the contact region BDR is formed. The contact region BDR is formed by performing ion implantation of boron (B) or arsenic difluoride (BF2), for example, through the source contact SCT. The impurity density of the contact region BDR is, for example, about $5\times10^{18}$ $cm^{-3}$~$1\times10^{20}$ $cm^3$. The optimum range of the impurity density is, for example, about $1\times10^{19}$ $cm^{-3}$~$5\times10^{19}$ $cm^{-3}$. Incidentally, following dry etching of the interlayer insulating film IF, dry etching of the semiconductor substrate SUB may be performed. In this case, it is formed so as to penetrate the source region SR and reach the second impurity region (base region BR). Next, the source contact plug is formed. The source contact plug is formed that after forming a titanium (Ti) film and a titanium nitride (TiN) film in the source contact SCT by, for example, CVD method, a tungsten (W) film is embedded, and the tungsten film on the interlayer insulating film IF is removed by CMP. Next, the source wiring LS is formed. The source wiring LS is formed, for example, by forming an aluminum (Al) film on the interlayer insulating film IF by sputtering method and patterning the aluminum film by performing photolithography and dry etching. Thereafter, the semiconductor device SDV is ground to a predetermined thickness. And a layer of titanium-nickel-silver (Ti—Ni—Ag) or the like is formed on a bottom surface of the semiconductor device SDV by, for example, a sputtering method. Thereby, the drain electrode DE is formed.

FIG. 11 shows a partial plan view of the element region SA of FIG. 1. In FIG. 11, the arrangement of the gate trench GT, gate insulating film GI, the gate electrode GE, the source contact SCT and the column area CR are illustrated. The gate trench GT is formed in the stripe shape in the element region SA. The source contact SCT is disposed in the center between the gate trenches GT that are separated from each other and are formed in the stripe shape. The column region CR is located in the center between the gate trenches GT spaced from each other, that is, below the source contact SCT. Further, the planar shape of the column region CR is a circular or quadrangular dot, and each of the plurality of column regions CR is disposed apart from each other. In FIG. 11, the column regions CR are shown as square dots, but they may be arranged in the staggered manner (see FIG. 12). Further, the square dots are not only arranged in the square arrangement but may be formed in the stripe shape parallel to the gate trench GT (see FIG. 13).

The effect of the second embodiment will be explained. For comparison, the comparative example will be described. In the semiconductor device SDV according to the comparative example shown in FIG. 2, by reducing the pitch of the gate trench GT, the column region CR contacts the gate trench GT and inhibiting the current path.

In the semiconductor device SDV described above, in contrast to the semiconductor device SDV according to the comparative example, since third impurity region of the first impurity type (column control region CSR) is formed in the first impurity region (drift region DRR) covering the bottom portion of the gate trench GT, even if the pitch of the gate trench GT is reduced, the column region CR does not come into contact with the gate trench GT. And then, it does not inhibit the current path. Therefore, it is possible to reduce the pitch of the gate trench GT, it is possible to reduce the chip area.

Third Embodiment

A third embodiment is a modified example of the first embodiment and the second embodiment. A partial plan view of the semiconductor device of the third embodiment is similar to a construction shown in FIG. 12 used for the explanation in the first embodiment. And a shape of gate trench GT is striped shape. The source contact SCT is disposed in the center between the gate trenches GT that are separated from each other and are formed in the stripe shape. The column region CR is located in the center between the gate trenches GT spaced from each other, that is, below the source contact SCT and is formed in the stripe shape. Cross-sectional view is the same as FIG. 3 or FIG. 14. Gate trench GT is formed from a top surface of the semiconductor substrate SUB toward a bottom surface thereof, penetrating the source region SR and the base region BR, through the column region CR, and reaching the drift region DRR. The impurity density of the column control region CSR is higher than the impurity density of the drift region DRR. The column control region CSR is in contact with the column region CR. Even the column region CR in the striped shape according to the third embodiment, it is possible to prevent contacting with the gate trench GT by the column control region CSR. In addition, since a part of the drift region DRR becomes the column control region CSR having a higher impurity density, there is also an effect of lowering the resistance value and the on-resistance can be reduced.

Fourth Embodiment

A fourth embodiment is a modified example of the first embodiment and the second embodiment. The partial plan view of the semiconductor device of the fourth embodiment is similar to the construction shown in FIG. 12 used for the explanation in the first embodiment. The gate trench GT has the stripe shape. The source contact SCT is disposed in the center between the gate trenches GT that are separated from each other and are formed in the stripe shape. The column region CR is located in the center between the gate trenches GT spaced from each other, that is, below the source contact SCT. And the column region CR is formed in a circular shape or a quadrangular shape and disposed in a staggered manner. Cross-sectional view is the same as FIG. 3 or FIG. 14. Gate trench GT is formed from the top surface of the semiconductor substrate SUB toward the bottom surface thereof, penetrating the source region SR and the base region BR, through the column region CR, and reaching the drift region DRR. The impurity density of the column control region CSR is higher than the impurity density of the drift region DRR. The column control region CSR is in contact with the column region CR. Even the column region CR in a staggered arrangement according to the fourth embodiment, it is possible to prevent contacting with the gate trench GT by the column control region CSR. In addition, since a part of the drift region DRR becomes the column control region CSR having a higher impurity density, there is also an effect of lowering the resistance value and the on-resistance can be reduced.

The semiconductor device described in the respective embodiments can be combined in various manners as required.

Although the invention made by the present inventor has been specifically described based on the embodiment, the present invention is not limited to the as described above embodiment, and it is needless to say that various modifications can be made without departing from the gist thereof. Part of the contents described in the above embodiments will be described below.

(Additional Statement 1)

A manufacturing method of a semiconductor device, comprising the steps of:
  (a) preparing a semiconductor substrate;
  (b) forming a first impurity region of a first conductivity type on the semiconductor substrate by performing an epitaxial growth method;
  (c) forming a second impurity region of the first conductivity type and a third impurity region of the first conductivity type in the first impurity region by performing ion implantation;
  (d) forming a first gate trench in the first impurity region to reach the second impurity region, and forming a second gate trench in the first impurity region to reach the third impurity region;
  (e) forming a gate insulating film in each inside of the first gate trench and the second gate trench respectively;
  (f) forming gate electrodes so as to embed in the first gate trench and the second gate trench via the gate insulating film;
  (g) forming a forth impurity region of a second conductivity type opposite to the first conductivity type in a top portion of the first impurity region so as to leave a bottom portion of the first impurity region, and forming a source region in the first impurity region, and the third impurity region and the source region are formed in this order; and
  (h) forming a column region of the second conductivity type in the first impurity region between the first gate trench and the second gate trench by performing ion implantation, wherein
  a depth of a bottom portion of the column region is deeper than a depth of each of bottom portions of the first gate trench and the second gate trench.

(Additional Statement 2)

The manufacturing method of the semiconductor device according to the additional statement 1, wherein an impurity density of the second impurity region is higher than an impurity density of the first impurity region.

(Additional Statement 3)

The manufacturing method of the semiconductor device according to the additional statement 1, wherein the column region overlaps the second impurity region in plan view.

What is claimed is:

1. A manufacturing method of a semiconductor device, the manufacturing method comprising steps of:
  (a) preparing a semiconductor substrate;
  (b) after the step of (a), forming a first impurity region of a first conductivity type on the semiconductor substrate by performing an epitaxial growth method;

(c) after the step of (b), forming a first gate trench and a second gate trench to reach the first impurity region;

(d) after the step of (c), forming a second impurity region of the first conductivity type in the first impurity region so as to cover a bottom portion of the first gate trench by performing ion implantation;

(e) after the step of (d), forming a gate insulating film in each inside of the first gate trench and the second gate trench respectively;

(f) after the step of (e), forming gate electrodes so as to embed in the first gate trench and the second gate trench via the gate insulating film;

(g) after the step of (f), forming a third impurity region of a second conductivity type opposite to the first conductivity type in a top portion of the first impurity region so as to leave a bottom portion of the first impurity region, and forming a source region in the first impurity region, and the third impurity region and the source region are formed in this order; and (h) after the step of (g), forming a column region of the second conductivity type in the first impurity region between the first gate trench and the second gate trench by performing ion implantation such that the second impurity region and the column region overlap each other in plan view, wherein a depth of a bottom portion of the column region is deeper than a depth of each of bottom portions of the first gate trench and the second gate trench, and wherein the column region is in contact with a bottom surface of the third impurity region.

2. The manufacturing method of the semiconductor device according to claim 1, wherein an impurity density of the second impurity region is higher than an impurity density of the first impurity region.

* * * * *